United States Patent [19]

Seliger

[11] 4,368,215
[45] Jan. 11, 1983

[54] HIGH RESOLUTION MASKING PROCESS FOR MINIMIZING SCATTERING AND LATERAL DEFLECTION IN COLLIMATED ION BEAMS

[75] Inventor: Robert L. Seliger, Agoura, Calif.
[73] Assignee: Hughes Aircraft Company, Culver City, Calif.
[21] Appl. No.: 227,029
[22] Filed: Jan. 21, 1981

Related U.S. Application Data

[60] Continuation of Ser. No. 990,449, Apr. 27, 1978, which is a continuation-in-part of Ser. No. 893,649, Apr. 5, 1978, abandoned, which is a division of Ser. No. 794,288, May 5, 1977, Pat. No. 4,101,782, which is a continuation of Ser. No. 626,425, Oct. 28, 1975, abandoned.

[51] Int. Cl.³ .............................................. B05D 3/06
[52] U.S. Cl. .................................... 427/38; 427/43.1
[58] Field of Search ................................ 427/38, 43.1

Primary Examiner—Bernard D. Pianalto
Attorney, Agent, or Firm—William J. Bethurum; W. H. MacAllister

[57] ABSTRACT

The specification describes a process for masking a collimated ion beam for either forming resist patterns on selected substrates or for other selective ion implantation purposes. This process includes the steps of forming an ion absorption mask on the surface of a hyper thin supporting membrane and thereafter aligning the mask with a substrate having a layer of resist thereon. Next, the ion absorption mask is exposed to a beam of ions which pass through certain areas of the absorption mask and into the resist layer to thereby expose selected regions in the resist layer (i.e., to increase or decrease the solubility of the resist to a chosen developer). In a specific embodiment of the invention, the ion absorption mask is formed by initially anodizing an aluminum substrate to form a thin coating of aluminum oxide thereon, and thereafter depositing a gold mask on one surface of the aluminum oxide coating. Certain regions of the aluminum substrate beneath the gold mask are removed to expose the aluminum oxide immediately beneath the gold mask, thereby forming a thin taut aluminum oxide membrane which supports the gold ion absorption mask.

2 Claims, 7 Drawing Figures

HIGH RESOLUTION MASKING PROCESS FOR MINIMIZING SCATTERING AND LATERAL DEFLECTION IN COLLIMATED ION BEAMS

This is a continuation of application Ser. No. 990,449, filed Apr. 27, 1978 which, in turn, is a continuation-in-part of application Ser. No. 893,649, filed Apr. 5, 1978, abandoned which, in turn, is a division of application Ser. No. 794,288, filed May 5, 1977, issud July 18, 1978 (U.S. Pat. No. 4,101,782) which, in turn, is a continuation of application Ser. No. 626,425, filed Oct. 28, 1975 and abandoned on May 5, 1977.

FIELD OF THE INVENTION

This invention relates generally to the arts of micropattern generation and mask fabrication and more particularly to a novel ion beam lithographic process for forming resist patterns on selected substrates, selective ion implantation, or the like. The specification also describes a subcombination process for making hyperthin ion absorption masks uniquely adapted for use in the proton exposure of resist layers.

BACKGROUND

In the art of photolithography which has been useful for many years in the construction of semiconductor integrated circuits and devices, ultraviolet radiation has been useful as a means for exposing and developing a variety of known and commercially available photoresist materials. However, as a result of the diffracton limitations of standard photolithographic mask making processes which use ultraviolet radiation, the minimum resolution obtainable using this prior art process is about 1 micrometer.

To improve upon this resolution limitation of prior art photolithographic processes using ultraviolet radiation, two technologies have evolved. One of these technologies is known as "X-ray lithography" and is disclosed, for example, in an article by Henry I. Smith entitled "Fabrication Techniques for Surface Acoustic Wave and Thin Film Optical Devices" *Proceeding of the IEEE,* Vol. 62 No. 10, October, 1974, pages 1361–1387. A second technology which also involves an alternative approach to ultraviolet (UV) photolithography for mask fabrication is known as "electron projection lithography", and one process of the latter type is disclosed, for example, in U.S. Pat. No. 3,672,987 issued to T. W. O'Keeffe et al.

The above two technologies have demonstrated certain advantages over ultraviolet photolithography as a method of mask fabrication, and may in some instances overcome the diffraction limitations and achievable resolutions characteristic of UV processes. However, both the X-ray and electron projection processes are time consuming and do not readily lend themselves to large scale batch fabrication processing. For example, the time required for X-rays to expose patterns in a positive resist layer is prohibitively long and may require several hours to complete. Additionally, adverse proximity effects occur when exposing resist layers with closely spaced electron beams. Both of these latter disadvantages have been eliminated by the present invention.

THE INVENTION

One general purpose of the present invention is to introduce yet another, pattern generation process which, in certain applications, may be used instead of any of the above prior art replication processes. Furthermore, the present process is capable of producing resist patterns on selected substrates without the above difficulties of long exposure time or the proximity effects encountered in the these two prior art processes, respectively.

Another general purpose of this invention is to provide a novel process for selectively interrupting a collimated ion beam, for whatever purpose, while simultaneously minimizing the scatter angle and lateral deflection of the uninterrupted ions which are utilized for resist exposure, ion implantation doping, or the like.

To achieve the first of the above purposes, I have developed a process which involves, among other things, forming a selected ion absorption mask on the surface of a thin supporting membrane and then aligning the ion absorption mask with a substrate having a layer of resist thereon. Thereafter, ions are projected through certain areas of the ion absorption mask and into the layer of resist to expose predefined areas in the resist layer.

To achieve the second general purpose of this invention as stated above, a collimated ion beam is passed through a hyperthin amorphous membrane less than 5,000 angstroms in thickness and having an ion absorption pattern mask adjacent to and atop one surface thereof. This mask provides the selective interruption of the collimated ion beam, while the thin unmasked membrane minimizes the scattering and lateral deflection of the uninterrupted ions.

Accordingly, it is an object of the present invention to provide a new and improved ion lithographic process for forming resist patterns on selected substrates.

Another object is to provide a process of the type described in which certain resist exposure steps may be carried to completion in less time than it takes to complete the corresponding resist exposure steps in both X-ray lithographic process and electron projection lithographic processes.

Another object is to minimize the scattering and lateral deflection of a collimated ion beam, while simultaneously and selectively interrupting same in any desired masking pattern.

A further object is to provide a novel process for making an ion beam absorption mask which is particularly well suited for use in the generic resist pattern forming and selective ion implantation processes embodying the invention.

These and other objects and features of the invention will become more readily apparent in the following description of the accompanying drawings.

DETAILED DESCRIPTION OF THE DRAWING

Figure 1:
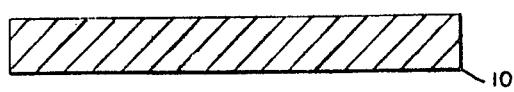
FIGS. 1 through 5 illustrate one process embodiment of the present invention which is utilized in the formation of an ion absorption mask.

Referring now in succession to FIGS. 1 through 5, there is shown in FIG. 1 an aluminum substrate or starting material 10 which is typically in the range of 5 to 20 mils in thickness, and the aluminum substrate 10 is initially cleaned and polished using standard metal processing techniques. The substrate 10 is thereafter transferred to an electrolytic bath (not shown), including an electrolyte such as ammonium citrate di-basic, through which an anodizing current is passed for a predetermined time to thereby form a thin aluminum oxide ($Al_2O_3$) coating over the entire front and back surface areas of the aluminum substrate 10.

Figure 2:
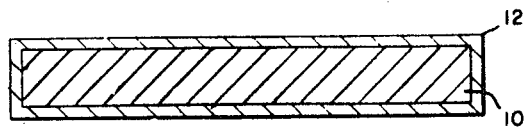
Figure 3:
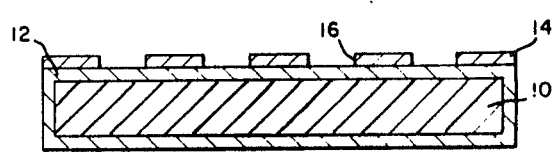

The anodized substrate 10 in FIG. 2 is then transferred to a conventional gold mask deposition station wherein conventional gold evaporation and masking techniques are utilized to form the gold mask 14 on the upper surface of the anodized coating 12. The gold mask 14 has a plurality of predefined openings 16 therein through which high energy ions may pass. The masked structure in FIG. 3 is then transferred to an ion beam machining station wherein a beam 18 of low energy ions such as argon is utilized to sputter remove a portion of the aluminum oxide coating from the backside of the Al substrate 10 in the region 20 indicated in FIG. 4. In this processing step, an ion beam machining mask (not shown) is placed over the backside of the aluminum oxide layer 12 and has an opening corresponding to the opening 22 in the $Al_2O_3$ coating 12. Ions transmitted by the machining mask strike the $Al_2O_3$ coating 12 and form the opening 22 therein. Apparatus suitable for carrying out this ion beam machining step is disclosed for example in U.S. Pat. No. 3,659,510 of H. L. Garvin et al.

Figure 4:
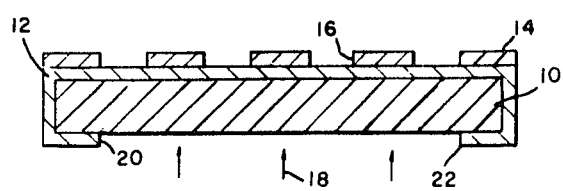

The structure of FIG. 4 is then transferred to a conventional chemical etching station wherein an etchant such as hydrochloric acid (HCl) is applied to the structure, and the HCl preferentially attacks the aluminum substrate 10 which is exposed by the opening 22 in the $Al_2O_3$ layer 12. After a certain time, the HCl etchant completely removes the aluminum 10 underlying the portions of the gold mask indicated in FIG. 5 to thereby leave a thin aluminum oxide membrane layer 25 on the order of preferably 2,000 angstroms in thickness, but in any case no greater than 5,000 angstroms in thickness. The $Al_2O_3$ membrane 25 fully supports the gold mask 14 in a taut fashion, and allows ions to pass through openings 26 in the gold mask 14 when the latter is subjected to an ion beam 28 as shown in FIG. 6.

Figure 6:
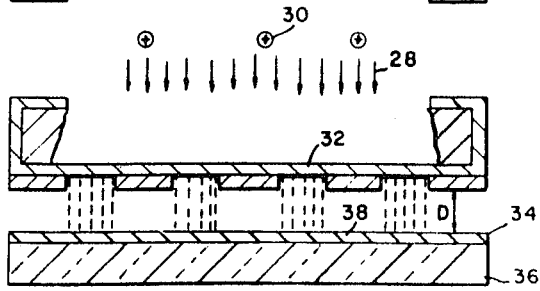
FIGS. 6 and 7 illustrate the resist pattern forming process according to the invention and utilizing the ion absorption mask of FIG. 5.
Figure 7:

The process illustrated in FIGS. 6 and 7 is the generic resist exposure process according to the invention and includes a source of protons 30 which is positioned in an appropriate particle accelerating field which, in turn, projects these protons through the exposed areas 32 of the aluminum oxide membrane 25 into a resist layer 34. The resist layer 34 has been previously deposited on a suitable substrate 36 and may, for example, be a commercially available polymethylmethacrylate resist (PMMA). In FIG. 6, a positive resist layer 34 is utilized, so that the areas 38 of the resist layer 34 which are bombarded by the collimated proton beam 28 are exposed by the protons and are subsequently removable from the surface of the substrate 36 by means of a commercially available developer, such as a solution of isopropal alcohol (60%) and methyl isobutyl ketone (40%).

In a typical high resolution application of this invention used for producing 0.5 micrometer wide lines in polymethylmethacralate resist (PMMA), the following approximate parameters can be used. A 120 keV collimated proton beam can be used to irradiate a 0.35 micrometer thick film of PMMA on a wafer, and using a dose of $1 \times 10^{13}$ ions/cm$^2$ in about 10 seconds. The proton beam current should be about 2 microamperes and the beam diameter should be about 1 centimeter. This proton beam 28 should be raster scanned over the ion absorption mask and will expose the PMMA resist at the rate of about 1 cm$^2$/sec. Preferably, the ion absorption mask in FIG. 5 should comprise of a 2,000 A thick $Al_2O_3$ membrane 25 which supports a gold film 16 of about 0.25 micrometers in thickness and patterned with openings 26 that are to be replicated in positive resist layer 34. The inter mask-wafer spacing "D" in FIG. 6 should be about 25 micrometers.

The present invention is not limited by the above specific parameters and may obviously be practiced using many variations thereof. For example, other light ions, such as helium, may be used instead of protons in the formation of selected patterns in resist. Additionally, the particularly particle absorption mask disclosed and claimed may be used with other particle acceleration processes, such as ion implantation doping, without departing from the true scope of the invention.

It is also to be understood that the present inventive process is neither limited to gold as an ion absorptive material nor to aluminum oxide, $Al_2O_3$, as the material for the amorphous membrane support member. Therefore, other high atomic number metals such as tungsten, molybdenum, tantalum, titanium, platinum, and even aluminum of sufficient thickness may be used in the presently claimed process to serve as the ion absorption material. For a further discussion of suitable metal masks for ion absorption purposes, reference may be made to a book by G. Dearnaley et al, *Ion Implantation*, North Holland Publishing Co., Amsterdam (1973) pages 502–515.

Figure 5:
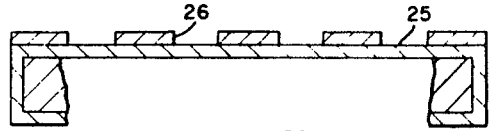

Similarly, other amorphous membrane materials such as silicon dioxide or silicon nitride formed initially on silicon substrates, or tantalum oxide formed on a tantalum substrate, may be etch-processed instead of the $Al_2O_3$ coated aluminum substrate and using the appropriate known and available substrate etchants to arrive at the general membrane mask geometry of FIG. 5 herein. Furthermore, these or other alternative hyperthin membrane masked structures may be provided either by membrane growth (e.g. oxidation) techniques or by sputter or plasma deposition or other thin film deposition processes known in the art. For etch-processing silicon substrates in the fabrication of thin oxide and nitride membranes, known anisotropic etchants, such as KOH-H$_2$O and isopropyl alcohol, may be used to anisotropically etch <100> oriented N-type silicon in order to insure that sufficient peripherial substrate support material remains after the etchant reaches through to the membrane layer.

In all mask fabrication processes used in practicing the present invention, the amorphous membrane thickness is preferably about 2,000 angstroms, and no greater than about 5,000 angstroms in thickness, in order to minimize scattering and lateral deflection of the collimated ion beam as it passes through the unmasked areas of the membrane.

What is claimed is:
1. A process for projecting an ion beam pattern onto a target layer of ion beam resist while minimizing the scattering and lateral deflection of ion beams defining said pattern, including the steps of:
   (a) providing a target layer of ion beam resist material at one chosen location,
   (b) providing a single taut hyperthin amorphous membrane of 5000 Angstroms or less in thickness;
   (c) providing an ion absorption mask on one surface of said membrane and corresponding to a predeter- mined pattern in which said ion beam is to be interrupted, (d) positioning said membrane and said ion absorption mask thereon at a second chosen location remote from the above said target layer of resist and between said target layer of resist and a source of collimated ion beams; and (e) projecting a collimated ion beam toward and substantially perpendicular to the surface of said membrane and through openings therein defined by said ion absorption mask, whereby said thin amorphous membrane introduces a minimum of lateral deflection and scattering into said ion beam relative to its initial direction of motion and thereby enhances the ion beam resolution at said target layer of resist on which said uninterrupted ions impinge.

2. The process defined in claim 1 wherein said ion absorption mask is formed of a selected high atomic number metal and said amorphous membrane on which said metal mask is disposed is on the order of 2000 Angstroms in thickness.

* * * * *